(12) United States Patent
Kim

(10) Patent No.: US 9,373,421 B2
(45) Date of Patent: Jun. 21, 2016

(54) SEMICONDUCTOR APPARATUS WITH REPAIR INFORMATION CONTROL FUNCTION

(71) Applicant: SK hynix Inc., Icheon-si, Gyeonggi-do (KR)

(72) Inventor: Jong Sam Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 37 days.

(21) Appl. No.: 14/488,568

(22) Filed: Sep. 17, 2014

(65) Prior Publication Data

US 2015/0364219 A1 Dec. 17, 2015

(30) Foreign Application Priority Data

Jun. 11, 2014 (KR) .......................... 10-2014-0071051

(51) Int. Cl.
*G11C 7/00* (2006.01)
*G11C 29/00* (2006.01)
*G11C 17/16* (2006.01)
*G11C 29/44* (2006.01)

(52) U.S. Cl.
CPC ................ *G11C 29/76* (2013.01); *G11C 17/16* (2013.01); *G11C 2029/4402* (2013.01)

(58) Field of Classification Search
CPC ........... G11C 17/16; G11C 2029/4402; G11C 11/4096; G11C 17/18; G11C 29/027; G11C 29/1201; G11C 7/1045; G11C 7/1057; G11C 7/1069; G11C 29/022; G11C 29/4401; G11C 11/418; G11C 11/419; G11C 7/10; G11C 29/76
USPC ............ 365/185.09, 94, 96, 189.011, 189.03, 365/189.14, 189.15, 189.16, 189.17, 365/189.18, 189.2, 189.05, 201, 200
See application file for complete search history.

(56) References Cited

U.S. PATENT DOCUMENTS

2015/0062997 A1* 3/2015 Baek ...................... G11C 17/16 365/96

FOREIGN PATENT DOCUMENTS

KR 100837802 B1 6/2008
KR 1020130103772 * 8/2013 ............. G11C 29/04

* cited by examiner

*Primary Examiner* — Fernando Hidalgo
(74) *Attorney, Agent, or Firm* — William Park & Associates Ltd.

(57) ABSTRACT

A semiconductor apparatus may include a global line configured to enable electrical coupling between a memory block and an input/output terminal, a fuse array configured to store and to transmit repair information through the global line, and a control unit configured to selectively enable or disable signal paths among the input/output terminal, the global line, and the fuse array according to an operation mode of the semiconductor apparatus.

20 Claims, 3 Drawing Sheets

| Operation SW | 1 | 2 | 3 | 4 | 5 | 6 | 7 | 8 |
|---|---|---|---|---|---|---|---|---|
| Normal(CMD) | ON | ON | OFF | OFF | ON | ON | OFF | OFF |
| Bootup(Bootact) | OFF | OFF | ON | OFF | OFF | OFF | ON | OFF |
| Repair information storage (TM1) | ON | OFF | ON | OFF | OFF | OFF | OFF | OFF |
| Repair information output (TM2) | OFF | ON | OFF | ON | OFF | OFF | OFF | OFF |

SEMICONDUCTOR APPARATUS WITH REPAIR INFORMATION CONTROL FUNCTION

CROSS-REFERENCES TO RELATED APPLICATION

The present application claims priority under 35 U.S.C. §119(a) to Korean application number 10-2014-0071051, filed on Jun. 11, 2014, in the Korean Intellectual Property Office, which is incorporated herein by reference in its entirety.

BACKGROUND

1. Technical Field

Various embodiments relate to a semiconductor apparatus, and more particularly, to a semiconductor apparatus with a repair information control function.

2. Related Art

A semiconductor apparatus may include a memory block, and the memory block may include a plurality of memory cells.

In many cases, a subset of the plurality of memory cells may include redundant memory cells for replacing memory cells that may have a defect (hereafter, referred to as defective memory cells).

A test process may be used to detect a defective cell from among the plurality of memory cells.

An operation of replacing a detected defective cell with a redundant cell may be referred to as a repair operation. The repair operation may involve replacing an address for accessing the defective cell with an address corresponding to the redundant cell replacing the defective cell.

The repair information may be addresses for accessing defective cells. The repair information may be stored in fuse sets.

During normal operation, when an address received at the semiconductor apparatus from a device external to the semiconductor apparatus is one of the addresses stored in the fuse sets, the received address may be replaced with an address corresponding to a redundant cell. This enables normal operation of the semiconductor apparatus.

SUMMARY

In an embodiment, a semiconductor apparatus may include a global line configured to enable electrical coupling between a memory block and an input/output terminal, a fuse array configured to store and to transmit repair information through the global line, and a control unit configured selectively enable or disable a signal paths among the input/output terminal, the global line, and the fuse array according to an operation mode of the semiconductor apparatus.

In an embodiment, a semiconductor apparatus may include a global line configured to enable electrical coupling between a memory block and an input/output terminal, a fuse array configured to one of store repair information in response to a plurality of control signals and to transmit previously stored repair information, a plurality of switches configured to enable electrical coupling between the fuse array and a node of the global line, between the node and the memory block, and between the node and the input/output terminal, and a control unit configured to determine an operation mode of the semiconductor apparatus in response to the plurality of control signals, and manage the plurality of switches according to the determined operation mode.

DETAILED DESCRIPTION

Various embodiments of a semiconductor apparatus with a repair information control function will be described with reference to the accompanying drawings.

Figure 1:
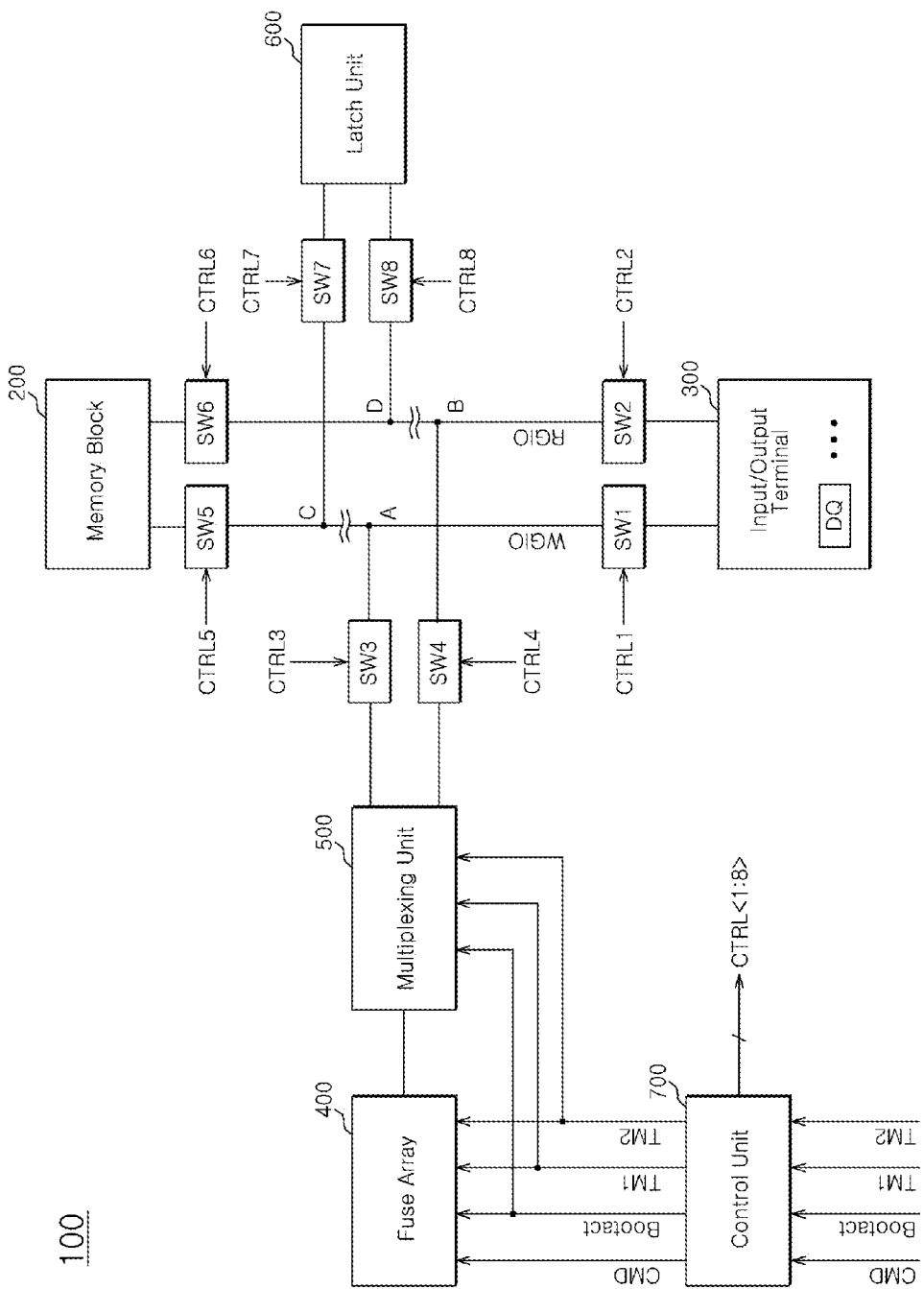
FIG. 1 is a block diagram representation of an embodiment of a semiconductor apparatus with a repair information control function.

As illustrated in FIG. 1, an embodiment of a semiconductor apparatus 100 with a repair information control function may include a memory block 200, an input/output terminal 300, a fuse array 400, a multiplexing unit 500, a latch unit 600, a plurality of switches SW1-SW8, and a control unit 700.

The memory block 200 may be configured to store data according to a write operation and output data according to a read operation.

Although not illustrated, the memory block 200 may include a circuit configuration for data input/output.

The memory block may include a plurality of memory cells. A subset of the plurality of memory cells may include redundant memory cells (hereafter, referred to as redundant cells) for replacing memory cells that may have a defect (hereafter, referred to as defective cells).

The input/output terminal 300 may be configured to perform input/output data operations with a device external to the semiconductor apparatus.

The input/output terminal 300 may include a plurality of pads. An example of such pads are DQ pads.

The memory block 200 and the input/output terminal 300 are configured to be electrically coupled via global line sets WGIO and RGIO.

WGIO may represent a write global line set for a write operation and RGIO may represent a read global line set for a read operation.

Such a configuration is an example where different global line sets are used for the write operation and the read operation. In alternative embodiments, a single global line set may be commonly used for both the read operation and the write operation.

The fuse array 400 may be configured to perform a repair information input/output operation in response to control signals CMD, Bootact, TM1, TM2.

The control signal CMD may represent a mode register set (MRS) command based on a normal mode. The control signal CMD may be received at the semiconductor apparatus 100 from a device external to the semiconductor apparatus 100.

The control signal Bootact may represent a signal indicating the start of an initialization mode of the semiconductor apparatus, that is, a boot-up mode. The control signal Bootact may be received at the semiconductor apparatus 100 from a device external to the semiconductor apparatus 100 or internally generated at the semiconductor apparatus 100.

The control signal TM1 may represent a test mode signal for designating a repair information storage operation. The control signal TM1 may be received at the semiconductor apparatus 100 from a device external to the semiconductor apparatus 100.

The control signal TM2 may represent a test mode signal for designating a repair information output operation. The control signal TM2 may be received at the semiconductor apparatus 100 from a device external to the semiconductor apparatus 100.

An operation of replacing a defective cell of the memory block 200 with a redundant cell may be referred to as a repair operation. The repair operation involves replacing an address for accessing the defective cell with an address corresponding to the redundant cell replacing with the defective cell.

The repair information may include addresses for accessing defective cells. The repair information may be stored in the fuse array 400.

A repair information storage operation may involve storing repair information in the fuse array 400. The repair information output operation may involve transmitting the repair information stored in the fuse array 400 to a device or component external to the fuse array 400.

The fuse array 400 may include a plurality of fuses.

The plurality of fuses may include electrical fuses. The electrical fuse may be electrically coupled or decoupled through a rupture operation.

The operation of storing repair information in the fuse array 400 may be performed as follows: specific fuses in of the fuse array 400 may be addressed based on repair information received from a device external to the semiconductor apparatus 100. The fuse array 400 may rupture the addressed fuses.

The fuse array 400 may be configured to block storage and transmit the repair information in response to the control signal CMD.

The fuse array 400 may be configured to transmit the stored repair information in response to the control signal Bootact.

The fuse array 400 may be configured to perform a repair information storage operation in response to the control signal TM1.

The fuse array 400 may be configured to transmit the stored repair information in response to the control signal TM2.

The multiplexing unit 500 may be configured to electrically couple the write global line set WGIO or the read global line set RGIO to the fuse array 400 in response to the control signals Bootact, TM1, TM2.

The multiplexing unit 500 may be configured to electrically decouple the write global line set WGIO or the read global line set RGIO from the fuse array 400 in response to the control signals Bootact, TM1, TM2.

The latch unit 600 may be configured to store repair information received from the fuse array 400. The stored repair information may be used for normal operation of the semiconductor apparatus 100 such as for example, for operations that are performed following the boot-up mode.

Each of the plurality of switches SW1-SW8 may be configured to enable the passage of signals or to block the passage of signals along an associated signal path in response to an associated one of a plurality of switching signals CTRL<1:8>.

The switch SW1 may enable or disable electrical coupling between a node A and the input/output terminal 300.

The switch SW5 may enable or disable electrical coupling between a node C and the memory block 200.

The switch SW2 may enable or disable electrical coupling between a node B and the input/output terminal 300.

The switch SW6 may enable or disable electrical coupling between a node D and the memory block 200.

The switch SW3 may enable or disable electrical coupling between the node A and the multiplexing unit 500.

The switch SW7 may enable or disable electrical coupling between the node C and the latch unit 600.

The switch SW4 may enable or disable electrical coupling between the node B and the multiplexing unit 500.

The switch SW8 may enable or disable electrical coupling between the node D and the latch unit 600.

The write global line set WGIO and the read global line set RGIO are the longest signal lines in the semiconductor apparatus 100.

Referring to FIG. 1, the distance between the node A and the node C is relatively substantially longer than the distance between the node A and the fuse array 400.

The distance between the node B and the node D is relatively substantially longer than the distance between the node D and the latch unit 600.

The control unit 700 may be configured to determine an operation mode of the semiconductor apparatus in response to the control signals CMD, Bootact, TM1, TM2, and control the signal paths by managing the plurality of switches SW1-SW8 according to the operation mode.

The control unit 700 may be configured to generate the plurality of switching signals CTRL<1:8> for managing the plurality of switches SW1-SW8 in response to the control signals CMD, Bootact, TM1, TM2.

The control unit 700 may be configured to transmit the control signals CMD, Bootact, TM1, TM2 to the fuse array 400.

Figures 2, 3:
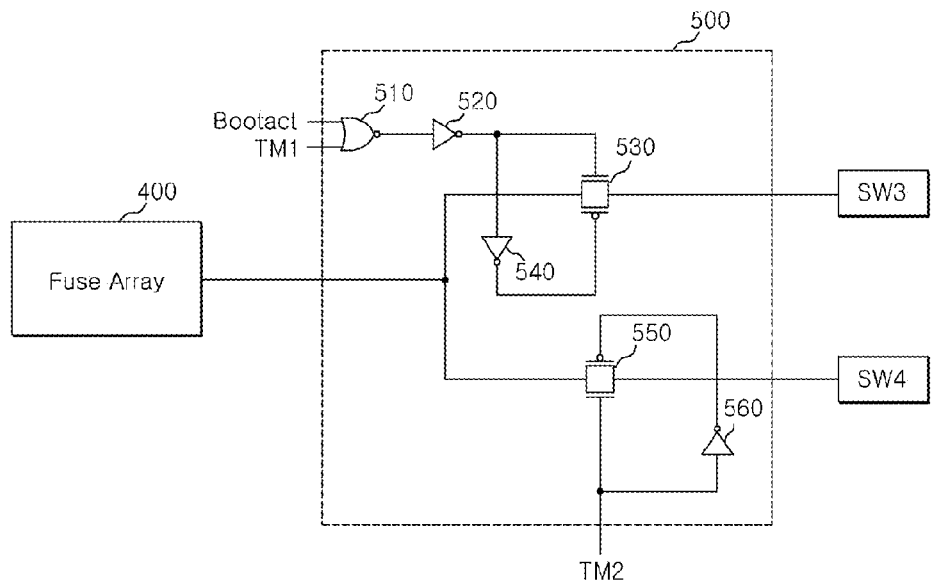
FIG. 2 is a circuit diagram representation of an embodiment of a multiplexing unit of FIG. 1.
FIG. 3 is a switch control table used to explain the operation of a control unit.

As illustrated in FIG. 2, the multiplexing unit 500 may include a NOR gate 510, a plurality of inverters 520, 540, 560, and a plurality of transmission gates 530, 550.

The NOR gate 510 and the inverter 520 may be configured to turn on the transmission gate 530 when one of the control signals Bootact and TM1 is activated.

When the transmission gate 530 is turned on, the fuse array 400 and the switch SW3 may be electrically coupled to each other.

The transmission gate 550 may be turned on when the control signal TM2 is activated.

When the transmission gate 550 is turned on, the fuse array 400 and the switch SW4 may be electrically coupled to each other.

The control unit 700 may be configured to determine an operation mode of the semiconductor apparatus 100 in response to the control signals CMD, Bootact, TM1, TM2, and generate the plurality of switching signals CTRL<1:8> for selectively turning on the plurality of switches SW1-SW8 to enable a corresponding signal path.

The control unit 700 may determine whether the semiconductor apparatus 100 is operating in a normal mode, in response to the control signal CMD.

The normal mode refers to an operation mode where data exchange operations are performed between the memory block 200 and the input/output terminal 300 during a read/write operation according to the control signal CMD, where the control signal CMD is the MRS command.

The control unit 700 may determine whether the semiconductor apparatus 100 is operating in the initialization mode in response to the control signal Bootact. The initialization mode is the boot up mode.

The boot-up mode refers to the operation mode where the repair information stored in the fuse array 400 is transmitted to the latch unit 600 according to the control signal Bootact before entering the normal mode.

The control unit 700 may determine whether the semiconductor apparatus 100 is operating in the repair information storage mode in response to the control signal TM1.

The repair information storage mode refers to the operation mode where an address corresponding to a defective cell that is detected through a test is stored in the fuse array 400.

The control unit 700 may determine whether the semiconductor apparatus 100 operating in the repair information output mode in response to the control signal TM2.

The repair information output mode refers to the mode where the repair information stored in the fuse array 400 is transmitted to a device external to the semiconductor apparatus 100.

As illustrated in FIG. 3, the control unit 700 may selectively turn on a subset of the plurality of switches SW1-SW8 where the combination of the subset of the switches SW1-SW8 that are turned on based on whether the semiconductor apparatus 100 is operating in the normal mode, the boot-up mode, the repair information storage mode, or the repair information output mode. The combination of the subset of the switches SW1-SW8 that are turned on define the signal path.

For example, when the semiconductor apparatus 100 is operating in normal mode, the control unit 700 may generate the plurality of switching signals CTRL<1:8> as '11001100'. The switches SW1, SW2, SW5, and SW6 may be turned on, and the other switches SW3, SW4, SW7, and SW8 may be turned off in response to the plurality of switching signals CTRL<1:8> as '11001100'.

When the semiconductor apparatus 100 is operating in boot-up mode, the control unit 700 may generate the plurality of switching signals CTRL<1:8> as '00100010'. The switches SW3 and SW7 may be turned on, and the other switches SW1, SW2, SW4, SW5, SW6, and SW8 may be turned off in response to the plurality of switching signals CTRL<1:8> as '00100010'.

When the semiconductor apparatus 100 is operating in repair information storage mode, the control unit 700 may generate the plurality of switching signals CTRL<1:8> as '10100000'. The switches SW1 and SW3 may be turned on, and the other switches SW2, SW4, SW5, SW6, SW7, and SW8 may be turned off in response to the plurality of switching signals CTRL<1:8> as '10100000'.

When the semiconductor apparatus 100 is operating in the repair information output mode, the control unit 700 may generate the plurality of switching signals CTRL<1:8> as '01010000'. The switches SW2 and SW4 may be turned on, and the other switches SW1, SW3, SW5, SW6, SW7, and SW8 may be turned off in response to the plurality of switching signals CTRL<1:8> as '01010000'.

Referring to FIGS. 1 to 3, the repair operation of an embodiment of the semiconductor apparatus 100 will be described below.

When the semiconductor apparatus 100 is operating in normal mode, the control signals Bootact, TM1, and TM2 may be deactivated to a low level.

Since the control signals Bootact, TM1, and TM2 are at the low level, the multiplexing unit 500 may electrically decouple the fuse array 400 from the switches SW3 and SW4.

The control unit 700 may generate the plurality of switching signals CTRL<1:8> in response to the MRS command of the normal mode. Then, from among the plurality of switches SW1-SW8, the switches SW1, SW2, SW5, and SW6 may be turned on, and the other switches SW3, SW4, SW7, and SW8 may be turned off.

While the switches SW1, SW2, SW5, and SW6 are turned on and the other switches SW3, SW4, SW7, and SW8 are turned off, a normal signal path may be formed between the memory block 200 and the input/output terminal 300 via the write global line set WGIO, the read global line set RGIO.

The signal path formed between the between the latch unit 600, the write global line set WGIO, the read global line set RGIO, and the fuse array 400 may be disabled or blocked.

When the semiconductor apparatus 100 is operating in boot-up mode, the control signal Bootact may be activated at a high level, and the other control signals CMD, TM1, and TM2 may be activated to the low level.

Since the control signal Bootact is activated to the high level, the multiplexing unit 500 may electrically couple the fuse array 400 to the switch SW3.

The control unit 700 may generate the plurality of switching signals CTRL<1:8> in response to the control signal Bootact. Then, from among the plurality of switches SW1-SW8, the switches SW3 and SW7 may be turned on, and the other switches SW1, SW2, SW4, SW5, SW6, and SW8 may be turned off.

While the switches SW3 and S7 are turned on and the other switches SW1, SW2, SW4, SW5, SW6, and SW8 are turned off, an initialization signal path may be formed from the fuse array 400 to the latch unit 600 via the multiplexing unit 500, the switch SW3, the write global line set WGIO, the switch SW7.

The fuse array 400 may transmit the previously stored repair information to the latch unit 600 in response to the control signal Bootact.

When an external address received at the semiconductor apparatus 100 operating in the normal mode, a read/write operation based on the external address or a replaced address may be performed based on the repair information stored in the latch unit 600.

When the semiconductor apparatus 100 is operating in the repair information storage mode, the control signal TM1 may be activated to the high level, and the other control signals CMD, Bootact, and TM2 may be deactivated to the low level.

Since the control signal TM1 is activated to the high level, the multiplexing unit 500 may electrically couple the fuse array 400 and the switch SW3.

The control unit 700 may generate the plurality of switching signals CTRL<1:8> in response to the control signal TM1. Then, from among the plurality of switches SW1-SW8, the switches SW1 and SW3 may be turned on, and the other switches SW2, SW4, SW5, SW6, SW7, and SW8 may be turned off.

While the switches SW1 and SW3 are turned on and the other switches SW2, SW4, SW5, SW6, SW7, and SW8 are turned off, a repair information storage signal path may be formed between the fuse array 400 and the input/output terminal 300, via the multiplexing unit 500, the switch SW3, the write global line set WGIO, and the switch SW1.

Based on repair information received from a device external to the semiconductor apparatus 100 the fuse array 400 may rupture the fuses associated with the address to store the repair information. The address may be defined by the signal path defined by the ruptured fuses in the fuse array 400.

When the semiconductor apparatus 100 is operating in repair information output mode, the control signal TM2 may be activated to the high level, and the other control signals CMD, Bootact, and TM1 may be deactivated to the low level.

Since the control signal TM2 is activated to the high level, the multiplexing unit 500 may electrically couple the fuse array 400 and the switch SW4.

The control unit 700 may generate the plurality of switching signals CTRL<1:8> in response to the control signal TM2. Thus, from among the plurality of switches SW1-SW8, the switches SW2 and SW4 may be turned on, and the other switches SW1, SW3, SW5, SW6, SW7, and SW8 may be turned off.

While the switches SW2 and SW4 are turned on and the other switches SW1, SW3, SW5, SW6, SW7, and SW8 are turned off, a repair information output signal path may be formed between the fuse array 400 and the input/output terminal 300 via the multiplexing unit 500, the switch SW4, the read global line set RGIO the switch SW2. The fuse array 400 may transmit the previously stored repair information to a device external to the semiconductor apparatus 100 through the input/output terminal 300 in response to the control signal TM2.

Figure 4:
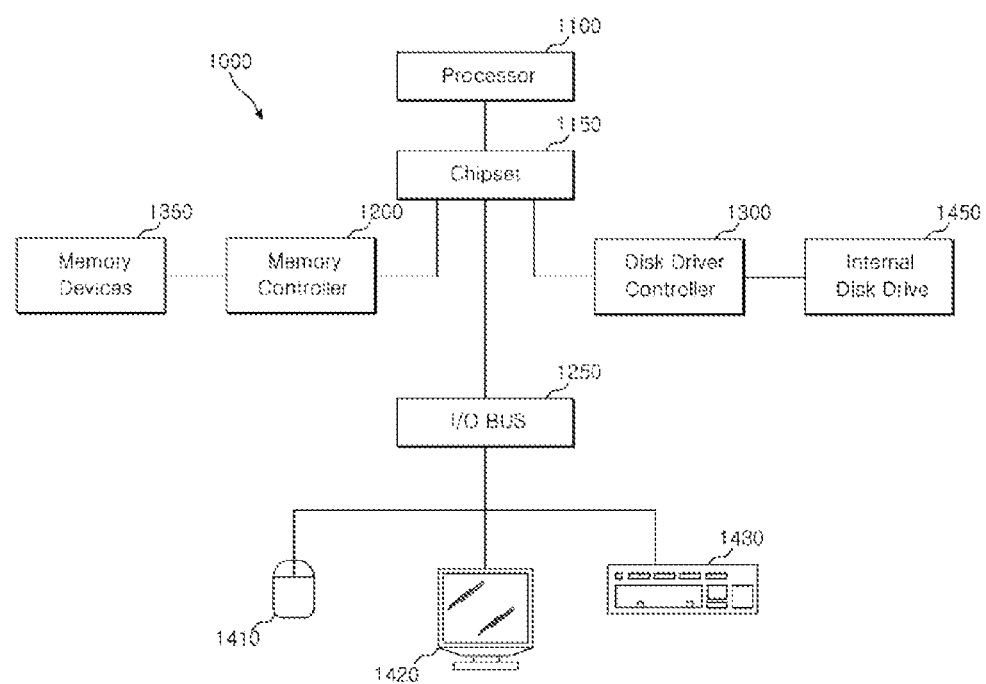
FIG. 4 is a block diagram representation of a system including an embodiment of a semiconductor apparatus including a repair information control function.

Referring to FIG. 4, a block diagram representation of a system 1000 including an embodiment of a semiconductor memory apparatus 1350 is shown. In an embodiment, the semiconductor memory apparatus 1350 is the semiconductor apparatus 100 shown in FIG. 1.

An embodiment of the semiconductor memory apparatus 1350 may include a global line configured to enable electrical coupling between a memory block and an input/output terminal, a fuse array configured to store and to transmit repair information through the global line, and a control unit configured selectively enable or disable a signal paths among the input/output terminal, the global line, and the fuse array according to an operation mode of the semiconductor apparatus.

An embodiment of the semiconductor memory apparatus 1350 may include a global line configured to enable electrical coupling between a memory block and an input/output terminal, a fuse array configured to one of store repair information in response to a plurality of control signals and to transmit previously stored repair information, a plurality of switches configured to enable electrical coupling between the fuse array and a node of the global line, between the node and the memory block, and between the node and the input/output terminal, and a control unit configured to determine an operation mode of the semiconductor apparatus in response to the plurality of control signals, and manage the plurality of switches according to the determined operation mode.

Examples of the semiconductor memory apparatus 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more semiconductor memory apparatuses 1350. The semiconductor memory apparatuses 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 4 is merely one example of a system employing a semiconductor memory apparatus 1350. In alternate embodiments, such as cellular phones or digital cameras, the components may differ from the embodiment shown in FIG. 4.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a global line configured to enable electrical coupling between a memory block and an input/output terminal;
   a fuse array configured to store and to transmit repair information through the global line; and
   a control unit configured to selectively enable or disable signal paths among the input/output terminal, the global line, and the fuse array according to an operation mode of the semiconductor apparatus.

2. The semiconductor apparatus according to claim 1, wherein the memory block comprises a plurality of memory cells and the repair information comprises address information for accessing a memory cell having a defect from among the plurality of memory cells.

3. The semiconductor apparatus according to claim 1, wherein the control unit is configured to enable a signal path between the input/output terminal and the fuse array via the global line when the operation mode is a repair information storage mode.

4. The semiconductor apparatus according to claim 1, wherein the control unit is configured to enable a signal path between the fuse array and the input/output terminal via the global line when the operation mode is a repair information output mode.

5. The semiconductor apparatus according to claim 1, wherein the control unit is configured to disable a signal path between the fuse array and the global line when the operation mode is a normal mode.

6. The semiconductor apparatus according to claim 1, wherein fuses, addressed through the input/output terminal and the global line, of the fuse array are ruptured when the operation mode is a repair information storage mode.

7. The semiconductor apparatus according to claim 1, wherein the fuse array is configured to transmit the repair information from the semiconductor apparatus through the global line and the input/output terminal when the operation mode is a repair information output mode.

8. The semiconductor apparatus according to claim 1, wherein the control unit is configured to enable a signal path from the fuse array to a latch unit in the semiconductor apparatus via the global line when the operation mode is an initialization mode.

9. The semiconductor apparatus according to claim 8, wherein the fuse array is configured to transmit the repair information for storage in the latch unit through the global line.

10. A semiconductor apparatus comprising:
a global line configured to enable electrical coupling between a memory block and an input/output terminal for data input/output;
a fuse array configured to one of store repair information in response to a plurality of control signals and to transmit previously stored repair information;
a plurality of switches configured to enable electrical coupling between the fuse array and a node of the global line, between the node and the memory block, and between the node and the input/output terminal; and
a control unit configured to determine an operation mode of the semiconductor apparatus in response to the plurality of control signals, and manage the plurality of switches according to the determined operation mode.

11. The semiconductor apparatus according to claim 10, wherein the global line comprises a write global line set for a write operation and a read global line set for a read operation.

12. The semiconductor apparatus according to claim 10, wherein the plurality of control signals define the operation mode of the semiconductor apparatus as one of a repair information storage mode, a repair information output mode, a normal mode, and an initialization mode.

13. The semiconductor apparatus according to claim 12, wherein the control unit is configured to manage the plurality of switches to enable a signal path between the input/output terminal and the fuse array via the global line when the operation mode of the semiconductor apparatus is determined to be the repair information storage mode.

14. The semiconductor apparatus according to claim 12, wherein the control unit is configured to manage the plurality of switches to enable a signal path between the fuse array and the input/output terminal via the global line when the operation mode of the semiconductor apparatus is determined to be the repair information output mode.

15. The semiconductor apparatus according to claim 12, wherein the control unit is configured to manage the plurality of switches to disable a signal path between the fuse array and the global line when the operation mode of the semiconductor apparatus is determined to be the normal mode.

16. The semiconductor apparatus according to claim 12, further comprising a latch unit configured to store repair information associated with the normal mode.

17. The semiconductor apparatus according to claim 16, wherein the control unit is configured to manage the plurality of switches to enable a signal path between the fuse array and the latch unit via the global line when the operation mode of the semiconductor apparatus is determined to be the initialization mode.

18. The semiconductor apparatus according to claim 12, wherein the fuse array is configured to rupture fuses addressed through the input/output terminal and the global line when the control signal associated with the repair information storage mode is activated.

19. The semiconductor apparatus according to claim 12, wherein the fuse array is configured to transmit previously stored repair information when the control signal associated with one of the initialization mode and repair information output mode is activated.

20. The semiconductor apparatus according to claim 10, wherein the memory block comprises a plurality of memory cells and the repair information comprises address information for accessing a memory cell having a defect from among the plurality of memory cells.

* * * * *